(12) United States Patent
Chen et al.

(10) Patent No.: US 8,378,457 B2
(45) Date of Patent: Feb. 19, 2013

(54) SILICON-GERMANIUM HETEROJUNCTION BIPOLAR TRANSISTOR

(75) Inventors: Fan Chen, Shanghai (CN); Xiongbin Chen, Shanghai (CN); Wensheng Qian, Shanghai (CN); Zhengliang Zhou, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/239,250

(22) Filed: Sep. 21, 2011

(65) Prior Publication Data

US 2012/0074465 A1    Mar. 29, 2012

(30) Foreign Application Priority Data

Sep. 26, 2010    (CN) .......................... 2010 1 0291766

(51) Int. Cl.
*H01L 27/102* (2006.01)
(52) U.S. Cl. ................. 257/587; 257/E29.033; 257/197
(58) Field of Classification Search ............ 257/E29.033, 257/585–588, 565, 583, 355–360, 173–176, 257/197
See application file for complete search history.

(56) References Cited

U.S. PATENT DOCUMENTS

| | | | |
|---|---|---|---|
| 2002/0158309 A1* | 10/2002 | Swanson et al. | 257/565 |
| 2002/0160562 A1* | 10/2002 | Babcock et al. | 438/207 |
| 2004/0048428 A1* | 3/2004 | Tanomura | 438/199 |
| 2005/0151223 A1* | 7/2005 | Voldman | 257/510 |
| 2006/0226446 A1* | 10/2006 | Ohnishi et al. | 257/197 |
| 2008/0164494 A1* | 7/2008 | Pagette et al. | 257/197 |
| 2009/0173928 A1* | 7/2009 | Rajendran et al. | 257/3 |
| 2012/0032233 A1* | 2/2012 | Qian | 257/197 |

* cited by examiner

*Primary Examiner* — Robert J Hoffberg
*Assistant Examiner* — Ali Naraghi
(74) *Attorney, Agent, or Firm* — Blakely, Sokoloff, Taylor & Zafman

(57) ABSTRACT

A SiGe HBT formed on a silicon substrate is disclosed. An active area is isolated by field oxide regions; a collector region is formed in the active area and extends into the bottom of the field oxide regions; pseudo buried layers are formed at the bottom of the field oxide regions, wherein each pseudo buried layer is separated by a lateral distance from the active area and connected to a lateral extension part of the collector region; first deep hole contacts are formed on top of the pseudo buried layers in the field oxide regions to pick up collector electrodes; a plurality of second deep hole contacts with a floating structure, are formed in the field oxide region on top of a lateral extension part of the collector region, wherein N-type implantation regions are formed at the bottom of the second deep hole contacts.

12 Claims, 1 Drawing Sheet

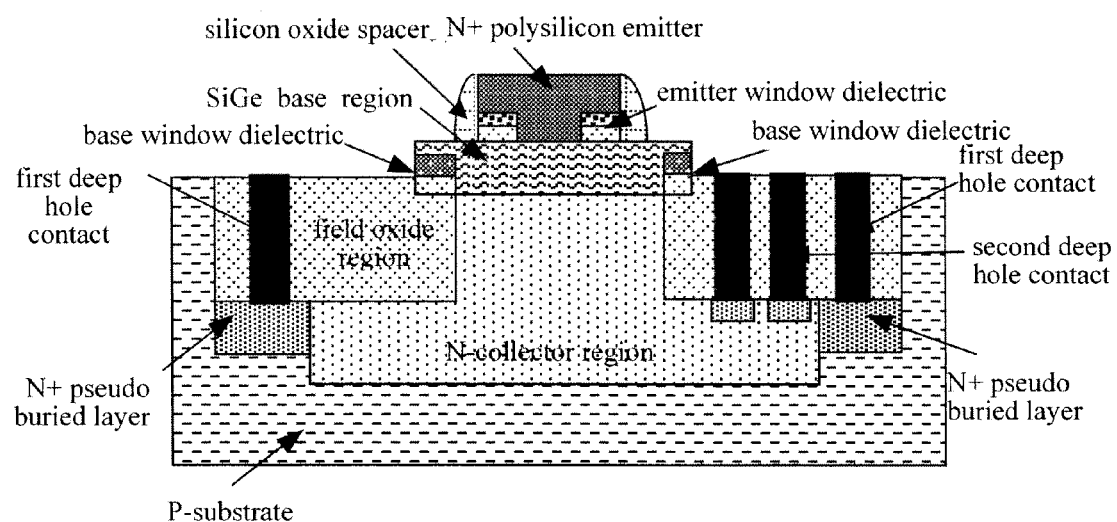

SILICON-GERMANIUM HETEROJUNCTION BIPOLAR TRANSISTOR

CROSS-REFERENCES TO RELATED APPLICATIONS

This application claims the priority of Chinese patent application number 201010291766.1, filed on Sep. 26, 2010, the entire contents of which are incorporated herein by reference.

TECHNICAL FIELD

The present invention relates to a semiconductor integrated circuit device, and especially relates to a silicon-germanium heterojunction bipolar transistor (SiGe HBT).

BACKGROUND OF THE INVENTION

With the increasing maturity of silicon-germanium (SiGe) process, radio-frequency (RF) circuit integration is becoming increasingly commonplace. Such modules as RF receiver, RF transmitter, switch and so on have a tendency towards integration. Therefore, both a low noise amplifier (LNA) for amplifying received signals and a power amplifier (PA) for amplifying the signals to be transmitted should be fabricated on an identical chip, which requires that, on the same SiGe process platform, high-voltage SiGe HBTs with different high breakdown voltages can be designed by merely changing the layout, so as to meet the requirements of various amplifiers. In the manufacturing process of an existing high-voltage SiGe HBT, buried layers, which are called pseudo buried layers, are formed at the bottom of field oxide regions on both sides of an active area; the pseudo buried layers are heavily N-doped; deep hole contacts formed by etching the field oxide regions are directly connected to the pseudo buried layers to pick up the collector region. In the case that a CMOS process is not used, a high-voltage resistant device can be easily manufactured, as few thermal processes are involved. However, once the SiGe HBT is integrated with a CMOS device, thermal processes of the CMOS process will cause the diffusion of the pseudo buried layers, which will lead to a great drop in the breakdown voltage of the device.

There are some methods capable of increasing the breakdown voltage of the device shown as follows: 1) controlling the thermal processes of CMOS; 2) controlling the doping concentration of the collector region of a transistor; 3) performing implantation at positions far from the collector region to form pseudo buried layers far from the collector region, in this way, the diffusion of the pseudo buried layers into the collector region during thermal processes will be reduced with the increase of the distance between the pseudo buried layers and the collector region. However, the above method 3) has a negative effect that the saturation voltage drop of the device will be significantly large, because although the amount of impurities that diffuse into the collector region decreases after the pseudo buried layers are arranged at farther positions, at the same time, the length of the current paths is increased and moreover, as the doping concentration of the lengthened paths are not very high, a large increase in device resistance is resulted.

SUMMARY OF THE INVENTION

The present invention is to provide a SiGe HBT which is not only capable to increase breakdown voltage of the device, but also can shorten current paths of the device, and reduce the resistance and saturation voltage drop of the device.

To achieve the above goal, the SiGe HBT provided by the present invention is formed on a P-type silicon substrate, wherein an active area is isolated by field oxide regions. The SiGe HBT comprises:

A collector region, composed of an N-type ion implantation region formed in the active area, wherein, the collector region has a depth larger than that of the bottom of the field oxide regions and the collector region laterally extends into the bottom of the field oxide regions on both sides of the active area; the N-type ion implantation performed to form the collector region has following process conditions: the implantation dose is from 1e12 to 5e14 cm$^{-2}$ and the implantation energy is from 50 to 500 KeV.

Pseudo buried layers, composed of N-type ion implantation regions formed at the bottom of the field oxide regions on both sides of the active area; each pseudo buried layer is separated by a lateral distance from the active area in a lateral direction, and is in contact with a lateral extension part of the collector region which laterally extends into the bottom of the field oxide regions; a breakdown voltage of the SiGe HBT is adjustable by adjusting the lateral distances between the pseudo buried layers and the active area; the N-type ion implantation performed to form the pseudo buried layers has following process conditions: the implantation dose is from 1e14 to 1e16 cm$^{-2}$ and the implantation energy is from 1 to 100 KeV; the lateral distance between each pseudo buried layer and a corresponding edge of the active area is larger than 0.4 μm.

First deep hole contacts, respectively formed on top of a pseudo buried layer through the respective field oxide region and connected to the pseudo buried layer; each first deep hole contact picks up a collector electrode by connecting to an upper metal layer; a plurality of second deep hole contacts formed in the field oxide region on top of a lateral extension part of the collector region and connected to the lateral extension part, wherein, an N-type implantation region is formed at a contact area between each second deep hole contact and the lateral extension part of the collector region; the doping concentration of the N-type implantation regions satisfies the condition to form an ohmic contact between the N-type implantation region and a metal of the respective second deep hole contact; top parts of the second deep hole contacts are not connected to the upper metal layer so as to form floating structures; the first deep hole contacts are formed by first forming a deep hole on top of the pseudo buried layers in the field oxide region, and then depositing a titanium/titanium nitride barrier metal layer in the deep hole and filling tungsten into the deep hole; the second deep hole contacts are formed by first forming a deep hole on top of the lateral extension part of the collector region in the field oxide region, and then depositing a titanium/titanium nitride barrier metal layer in the deep hole and filling tungsten into the deep hole; after deep holes of the second deep hole contacts have been formed, the N-type implantation regions are formed by performing an ion implantation to the substrate at the bottom of the deep holes with following process conditions: the impurity implanted is phosphorus or arsenic, the implantation dose is from 1e13 to 1e15 cm$^{-2}$ and the implantation energy is from 3 to 50 KeV.

A base region, composed of a P-type silicon-germanium epitaxial layer formed on the silicon substrate; the base region comprises an intrinsic base region which is formed on top of the active area and forms a contact with the collector region, and an extrinsic base region which is formed on top of the field oxide regions for forming a base electrode; the position and size of the intrinsic base region are determined by a base window, which is located on top of the active area and has a size larger than or equal to that of the active area; the position and size of the base window are defined by a base window dielectric layer, which comprises a first silicon oxide film and a polysilicon film, wherein the first silicon oxide film is formed on the silicon substrate, and the polysilicon film is formed on the first silicon oxide film; the P-type silicon-germanium epitaxial layer is doped by a boron ion implantation performed with following process conditions: the implantation dose is from 1e14 to 1e16 $cm^{-2}$ and the implantation energy is from 1 to 50 KeV; germanium has a trapezoidal or triangular distribution.

An emitter region, composed of an N-type polysilicon formed on top of the intrinsic base region and forming a contact with the intrinsic base region; the position and size of the emitter region are determined by an emitter window, which is located on top of the intrinsic base region and has a size smaller than that of the active area the position and size of the emitter window are defined by an emitter window dielectric layer, which comprises a second silicon oxide film and a silicon nitride film, wherein the second silicon oxide film is formed on the P-type silicon-germanium epitaxial layer, and the silicon nitride film is formed on the second silicon oxide film; the N-type polysilicon of the emitter region is doped by an N-type ion implantation performed with following process conditions: the implantation dose is from 1e14 to 1e16 $cm^{-2}$ and the implantation energy is from 10 to 200 KeV; silicon oxide spacers are formed on side faces of the emitter region; the surfaces of both the emitter region and the extrinsic base region are coated with silicide.

The present invention is capable of: 1) adjusting the breakdown voltage of the device by adjusting the lateral distances between the pseudo buried layers and the active area, in such a way that the breakdown voltage of the device increases with the increase of the lateral distance between each pseudo buried layers and a corresponding edge of the active area; 2) guaranteeing a high breakdown voltage of the device even in the case that a CMOS process with many thermal processes is involved; 3) shortening current paths of the device and reducing resistance by forming N-type implantation regions at the bottom of the second deep hole contacts and thus reducing the saturation voltage drop of the device.

BRIEF DESCRIPTION OF THE DRAWINGS

The present invention will be further described and specified by using figure and embodiment as follows:

FIG. 1 shows the structure of a device of an embodiment of the present invention.

DETAILED DESCRIPTION OF THE INVENTION

FIG. 1 shows the structure of the device of an embodiment of the present invention. The SiGe HBT provided by the present invention is formed on a P-type silicon substrate, wherein an active area is isolated by field oxide regions. The SiGe HBT comprises:

A collector region, shown as the N-collector region in FIG. 1, composed of an N-type ion implantation region formed in the active area, wherein, the collector region has a depth larger than that of the bottom of the field oxide regions and the collector region laterally extends into the bottom of the field oxide regions on both sides of the active area; the N-type ion implantation performed to form the collector region has following process conditions: the implantation dose is from 1e12 to 5e14 $cm^{-2}$ and the implantation energy is from 50 to 500 KeV.

Pseudo buried layers, shown as the N+ pseudo buried layers in FIG. 1, composed of N-type ion implantation regions formed at the bottom of the field oxide regions on both sides of the active area; each pseudo buried layer is separated by a lateral distance from the active area in a lateral direction, and is in contact with a lateral extension part of the collector region which laterally extends into the bottom of the field oxide regions. The breakdown voltage of the SiGe HBT can be adjusted by adjusting the lateral distances between the pseudo buried layers and the active area. The N-type ion implantation performed to form the pseudo buried layers has following process conditions: the implantation dose is from 1e14 to 1e16 $cm^{-2}$ and the implantation energy is from 1 to 100 KeV. The lateral distance between each pseudo buried layer and a corresponding edge of the active area is larger than 0.4 µm.

First deep hole contacts, respectively formed on top of a pseudo buried layer through the respective field oxide region and connected to the pseudo buried layer; each first deep hole contact picks up a collector electrode by connecting to an upper metal layer.

A plurality of second deep hole contacts formed in the field oxide region on top of a lateral extension part of the collector region and connected to the lateral extension part, wherein, an N-type implantation region is formed at the contact area between each second deep hole contact and the lateral extension part of the collector region; the doping concentration of the N-type implantation regions satisfies the condition to form an ohmic contact between the N-type implantation region and a metal of the respective second deep hole contact; top parts of the second deep hole contacts are not connected to the upper metal layer so as to form floating structures. In the embodiment of the present invention, the number of the second deep hole contacts is 2; both of the second deep hole contacts are formed in the same field oxide region on one side of the active area; the lateral extension part of the collector region refers to the part of the collector region that laterally extends into the bottom of the field oxide regions on both sides of the active area; the first deep hole contacts are formed by first forming a deep hole on top of the pseudo buried layers in the field oxide region, and then depositing a titanium/titanium nitride barrier metal layer in the deep hole and filling tungsten into the deep hole; the second deep hole contacts are formed by first forming a deep hole on top of the lateral extension part of the collector region in the field oxide region, and then depositing a titanium/titanium nitride barrier metal layer in the deep hole and filling tungsten into the deep hole; after the deep holes of the second deep hole contacts have been formed, the N-type implantation regions are formed by performing an ion implantation to the substrate at the bottom of the deep holes with following process conditions: the impurity implanted is phosphorus or arsenic, the implantation dose is from 1e13 to 1e15 $cm^{-2}$ and the implantation energy is from 3 to 50 KeV.

A base region, shown as the SiGe base region in FIG. 1, composed of a P-type silicon-germanium epitaxial layer formed on the silicon substrate; the base region comprises an intrinsic base region which is formed on top of the active area and forms a contact with the collector region, and an extrinsic base region which is formed on top of the field oxide regions for forming a base electrode; the position and size of the intrinsic base region are determined by a base window, which is located on top of the active area and has a size larger than or equal to that of the active area: the position and size of the base window are defined by a base window dielectric layer, which comprises a first silicon oxide film and a polysilicon film, wherein the first silicon oxide film is formed on the silicon substrate, and the polysilicon film is formed on the first silicon oxide film; the P-type silicon-germanium epitaxial layer is doped by a boron ion implantation performed with following process conditions: the implantation dose is from 1e14 to 1e16 cm$^{-2}$ and the implantation energy is from 1 to 50 KeV; germanium has a trapezoidal or triangular distribution.

An emitter region, shown as the N+ polysilicon emitter region in FIG. 1, composed of an N-type polysilicon formed on top of the intrinsic base region and forming a contact with the intrinsic base region; the position and size of the emitter region are determined by an emitter window, which is located on top of the intrinsic base region and has a size smaller than that of the active area; the position and size of the emitter window are defined by an emitter window dielectric layer, which comprises a second silicon oxide film and a silicon nitride film, wherein the second silicon oxide film is formed on the P-type silicon-germanium epitaxial layer, and the silicon nitride film is formed on the second silicon oxide film; the N-type polysilicon of the emitter region is doped by an N-type ion implantation performed with following process conditions: the implantation dose is from 1e14 to 1e16 cm$^{-2}$ and the implantation energy is from 10 to 200 KeV; silicon oxide spacers are formed on side faces of the emitter region; the surfaces of both the emitter region and the extrinsic base region are coated with silicide.

While the present invention has been particularly shown and described with reference to the above embodiments thereof, it will be understood by those skilled in the art that various changes in form and details may be made without departing from the spirit and scope of the invention.

What is claimed is:

1. A silicon-germanium heterojunction bipolar transistor, formed on a P-type silicon substrate, wherein, an active area is isolated by field oxide regions, and the silicon-germanium heterojunction bipolar transistor comprises:
   a collector region, composed of an N-type ion implantation region formed in the active area, wherein, the collector region has a depth larger than that of the bottom of the field oxide regions and the collector region laterally extends into the bottom of the field oxide regions on both sides of the active area;
   pseudo buried layers, composed of N-type ion implantation regions formed at the bottom of the field oxide regions on both sides of the active area; each pseudo buried layer is separated by a lateral distance from the active area in a lateral direction, and is in contact with a lateral extension part of the collector region which laterally extends into the bottom of the field oxide regions; a breakdown voltage of the silicon-germanium heterojunction bipolar transistor is adjustable by adjusting the lateral distances between the pseudo buried layers and the active area;
   first deep hole contacts, respectively formed on top of a pseudo buried layer through the respective field oxide region and connected to the pseudo buried layer; each first deep hole contact picks up a collector electrode by connecting to an upper metal layer;
   a plurality of second deep hole contacts formed in the field oxide region on top of a lateral extension part of the collector region and connected to the lateral extension part, wherein, an N-type implantation region is formed at a contact area between each second deep hole contact and the lateral extension part of the collector region; the doping concentration of the N-type implantation regions satisfies the condition to form an ohmic contact between the N-type implantation region and a metal of the respective second deep hole contact; top parts of the second deep hole contacts are not connected to the upper metal layer so as to form floating structures;
   a base region, composed of a P-type silicon-germanium epitaxial layer formed on the silicon substrate; the base region comprises an intrinsic base region which is formed on top of the active area and forms a contact with the collector region, and an extrinsic base region which is formed on top of the field oxide regions for forming a base electrode;
   an emitter region, composed of an N-type polysilicon formed on top of the intrinsic base region and forming a contact with the intrinsic base region.

2. The silicon-germanium heterojunction bipolar transistor according to claim 1, wherein the N-type ion implantation performed to form the collector region has following process conditions: the implantation dose is from 1e12 to 5e14 cm$^{-2}$ and the implantation energy is from 50 to 500 KeV.

3. The silicon-germanium heterojunction bipolar transistor according to claim 1, wherein the N-type ion implantation performed to form the pseudo buried layers has following process conditions: the implantation dose is from 1e14 to 1e16 cm$^{-2}$ and the implantation energy is from 1 to 100 KeV.

4. The silicon-germanium heterojunction bipolar transistor according to claim 1, wherein the position and size of the intrinsic base region are determined by a base window, which is located on top of the active area and has a size larger than or equal to that of the active area; the position and size of the base window are defined by a base window dielectric layer, which comprises a first silicon oxide film and a polysilicon film, wherein the first silicon oxide film is formed on the silicon substrate, and the polysilicon film is formed on the first silicon oxide film.

5. The silicon-germanium heterojunction bipolar transistor according to claim 1, wherein the P-type silicon-germanium epitaxial layer is doped by a boron ion implantation performed with following process conditions: the implantation dose is from 1e14 to 1e16 cm$^{-2}$ and the implantation energy is from 1 to 50 KeV; germanium has a trapezoidal or triangular distribution.

6. The silicon-germanium heterojunction bipolar transistor according to claim 1, wherein the position and size of the emitter region are determined by an emitter window, which is located on top of the intrinsic base region and has a size smaller than that of the active area; the position and size of the emitter window are defined by an emitter window dielectric layer, which comprises a second silicon oxide film and a silicon nitride film, wherein the second silicon oxide film is formed on the P-type silicon-germanium epitaxial layer, and the silicon nitride film is formed on the second silicon oxide film.

7. The silicon-germanium heterojunction bipolar transistor according to claim 1, wherein the N-type polysilicon of the emitter region is doped by an N-type ion implantation performed with following process conditions: the implantation dose is from 1e14 to 1e16 cm$^{-2}$ and the implantation energy is from 10 to 200 KeV.

8. The silicon-germanium heterojunction bipolar transistor according to claim 1, wherein silicon oxide spacers are formed on side faces of the emitter region.

9. The silicon-germanium heterojunction bipolar transistor according to claim 1, wherein surfaces of both the emitter region and the extrinsic base region are coated with silicide.

10. The silicon-germanium heterojunction bipolar transistor according to claim 1, wherein the lateral distance between each pseudo buried layer and a corresponding edge of the active area is larger than 0.4 μm.

11. The silicon-germanium heterojunction bipolar transistor according to claim 1, wherein the first deep hole contacts are formed by first forming a deep hole on top of the pseudo buried layers in the field oxide region, and then depositing a titanium/titanium nitride barrier metal layer in the deep hole and filling tungsten into the deep hole; the second deep hole contacts are formed by first forming a deep hole on top of the lateral extension part of the collector region in the field oxide region, and then depositing a titanium/titanium nitride barrier metal layer in the deep hole and tilling tungsten into the deep hole.

12. The silicon-germanium heterojunction bipolar transistor according to claim 1, wherein after deep holes of the second deep hole contacts have been formed, the N-type implantation regions are formed by performing an ion implantation to the substrate at the bottom of the deep holes with following process conditions: the impurity implanted is phosphorus or arsenic, the implantation dose is from 1e13 to 1e15 $cm^{-2}$ and the implantation energy is from 3 to 50 KeV.

* * * * *

UNITED STATES PATENT AND TRADEMARK OFFICE
CERTIFICATE OF CORRECTION

PATENT NO. : 8,378,457 B2
APPLICATION NO. : 13/239250
DATED : February 19, 2013
INVENTOR(S) : Fan Chen et al.

Page 1 of 1

It is certified that error appears in the above-identified patent and that said Letters Patent is hereby corrected as shown below:

In the Claims, Column 8, Claim 11, line 2, please delete "tilling" and insert --filling--.

Signed and Sealed this
Second Day of July, 2013

Teresa Stanek Rea
*Acting Director of the United States Patent and Trademark Office*